United States Patent
Lee et al.

(10) Patent No.: US 6,876,237 B2
(45) Date of Patent: Apr. 5, 2005

(54) RESET-PULSE GENERATOR

(75) Inventors: Hsuan-Hsien Lee, Hsin-Chu (TW);
Chih-Hung Lu, Hsin-Chu (TW);
Guo-Yuan Ma, Hsin-Chu (TW);
Jin-Hsin Yang, Hsin-Chu (TW)

(73) Assignee: Pixart Imaging, Inc., Hsin-Chu (TW)

( * ) Notice: Subject to any disclaimer, the term of this patent is extended or adjusted under 35 U.S.C. 154(b) by 0 days.

(21) Appl. No.: 10/697,881

(22) Filed: Oct. 31, 2003

(65) Prior Publication Data

US 2004/0095173 A1 May 20, 2004

(30) Foreign Application Priority Data

Nov. 20, 2002 (TW) .......................................... 91133809 A

(51) Int. Cl.$^7$ ............................................... H03L 7/00
(52) U.S. Cl. ...................................... 327/143; 327/292
(58) Field of Search ................................. 327/142, 143, 327/198, 291, 292, 298

(56) References Cited

U.S. PATENT DOCUMENTS

| | | | | |
|---|---|---|---|---|
| 4,815,041 A | * | 3/1989 | Baylock | ........................ 326/98 |
| 4,982,116 A | * | 1/1991 | Lee | .............................. 327/144 |
| 5,801,561 A | * | 9/1998 | Wong et al. | ................. 327/143 |

* cited by examiner

Primary Examiner—Jeffrey Zweizig
(74) Attorney, Agent, or Firm—Rabin & Berdo, P.C.

(57) ABSTRACT

A reset pulse generator. The CPU generates an oscillating disable signal after initialization. The oscillating circuit is coupled to the CPU to output a sequence of reset pulses to the CPU. The oscillating disable circuit is coupled to the oscillating circuit for disabling the oscillating circuit and initiating normal mode CPU operation when the oscillating disable signal is received.

10 Claims, 3 Drawing Sheets

RESET-PULSE GENERATOR

BACKGROUND OF THE INVENTION

1. Field of the Invention

The present invention relates in general to a power-on reset circuit. In particular, the present invention relates to a reset pulse generator.

2. Description of the Related Art

Power-on reset circuits are generally applied in semiconductor circuits to initialize the chip at startup.

FIG. 1 shows a conventional power-on reset circuit. A high logic-level reset signal RESET is generated when a low logic-level power-on pulse POWER_ON is input to an inverter 10, (a Schmitt trigger for example). In addition, the reset signal RESET can also be generated by operating the manual switch 12. The logic-level of the input terminal of the Schmitt trigger 10 drops to low-logic level when the switch 12 is turned on. Thus, the reset signal RESET with high logic-level is generated. The Schmitt trigger 10 outputs the reset signal RESET with high logic-level to the CPU 14, the CPU 14 is then initialized according to the high logic-level reset signal RESET.

However, only a single reset signal RESET is provided to the CPU 14 by the conventional power-on reset circuit. Thus, if the initialization fails because of a timing error or other unexpected reasons, the initialization can't be performed again without another reset signal RESET, thus, the system crashes. Another reset signal RESET can be generated by operating the manual switch 12, but this switch usually only exists when a product is designed or tested. There is usually no switch included on finished consumer products, thus, the system crashes because the CPU has not been initialized.

SUMMARY OF THE INVENTION

The object of the present invention is thus to provide a power-on reset circuit, which outputs a sequence of reset pulses to the CPU, and stop outputs the reset pulse after identifying CPU initialization by detecting a signal generated by the CPU. Thus, ensuring that CPU has been initialized.

To achieve the above-mentioned object, the present invention provides a reset pulse generator. The CPU generates an oscillating disable signal after initialization. The oscillating circuit is coupled to the CPU to output a sequence of reset pulses to the CPU. The oscillating disable circuit is coupled to the oscillating circuit for disabling the oscillating circuit after the oscillating disable signal has been received and the CPU is operating normally.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The power-on reset circuits according to the present invention outputs a plurality of reset pulses to the CPU with an oscillating circuit, and disables the oscillating circuit to stop the initialization after detecting that the CPU has been initialized. The CPU then performs the follow up processes.

First Embodiment

Figure 2:
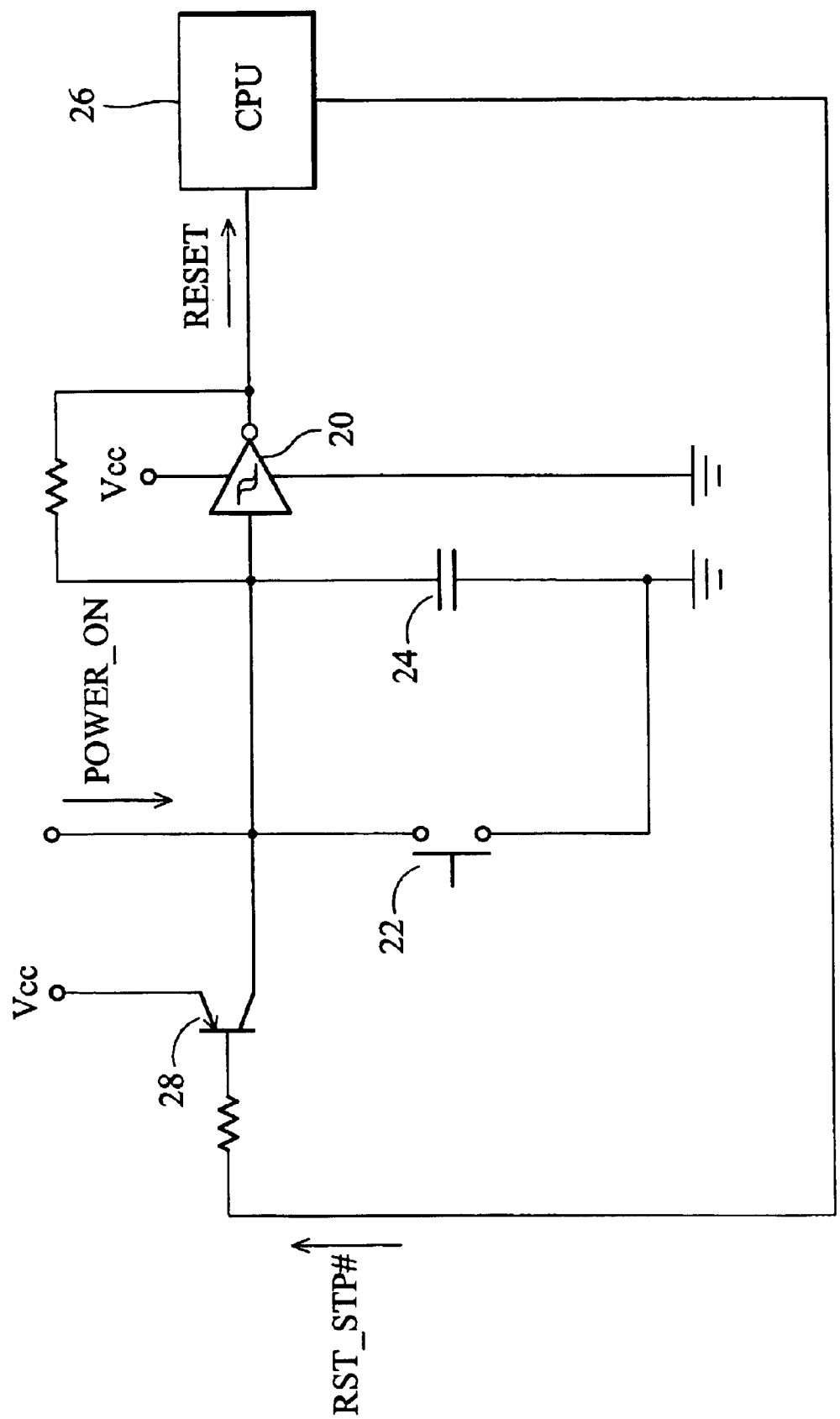
FIG. 2 shows a power-on reset circuit according to the first embodiment of the present invention.

FIG. 2 shows a power-on reset circuit according to the first embodiment of the present invention. A high logic-level reset signal RESET is generated when the low logic-level power-on pulse POWER_ON # is input to an inverter 20. In the first embodiment, the default level of the reset signal RESET is high-logic level. In addition, the inverter 20 can be a Schmitt trigger, which is more noise tolerant. The inverter of the power-on reset circuit according to the present invention, however, can be any type of inverter. In addition, the reset signal RESET is also generated by the operated the manual switch 22. The logic-level of the input terminal of the Schmitt trigger 20 drops to low-logic level when the switch 22 is turned on. Thus, the high logic-level reset signal RESET is generated. The Schmitt trigger 20 outputs the high logic-level reset signal RESET, which is fed back to the capacitor 24 to increase the voltage difference between both terminals of the capacitor 24. The Schmitt trigger 20 has different threshold voltages, which are high threshold voltage and low threshold voltage. Thus, when the voltage difference between both terminals of the capacitor 24 exceeds the high threshold voltage of the Schmitt trigger 20, the Schmitt trigger 20 outputs a low logic-level signal. In addition, the low logic-level signal is still fed back to the capacitor 24 to discharge it until the voltage difference between both terminals of the capacitor 24 is lower than the low threshold voltage. Thus, the oscillating circuit (Schmitt trigger) continuously outputs the reset signals RESET. The reset signals RESET, output by the Schmitt trigger 20 are input to the CPU 26. The CPU 26 is then initialized according to the high logic-level reset signal RESET. Because the CPU 26 continuously receives the reset signals RESET, even if the initialization of the CPU 26 fails, the initialization is performed again by triggering the following reset signal RESET. Thus, ensuring the success of the initialization of the CPU 26.

After the CPU 26 is initialized, the CPU 26 outputs an oscillating disable signal RST_STP# representing the completed initialization of the CPU 26. The oscillating disable signal RST_STP# is generated by changing the firmware or hardware of the CPU. According to the first embodiment of the present invention, the oscillating disable signal RST_STP# is at low-logic level, which turns on the switch 28. Here, the switch 28 can be a MOS transistor or a bipolar transistor. The switch 28 is a PNP transistor because the oscillating disable signal RST_STP# is at low-logic level. When the switch 28 is turned on, the voltage level of the input terminal of the Schmitt trigger 20 is increased to high-logic level by the power source Vcc. Thus, the Schmitt trigger 20 continuously outputs low-logic level signals. As mentioned above, the default logic-level of the reset signal RESET is high, thus, the reset of the CPU stops when the logic-level of the reset signal RESET goes to low, thus completing the power-on reset procedure. Here, the output period of the oscillating circuit must exceed the time period between the CPU receiving the reset signal RESET and the CPU outputting the oscillating disable signal RST_STP# representing completed initialization of the CPU, thus avoiding avoid a system error.

Second Embodiment

Figure 3:
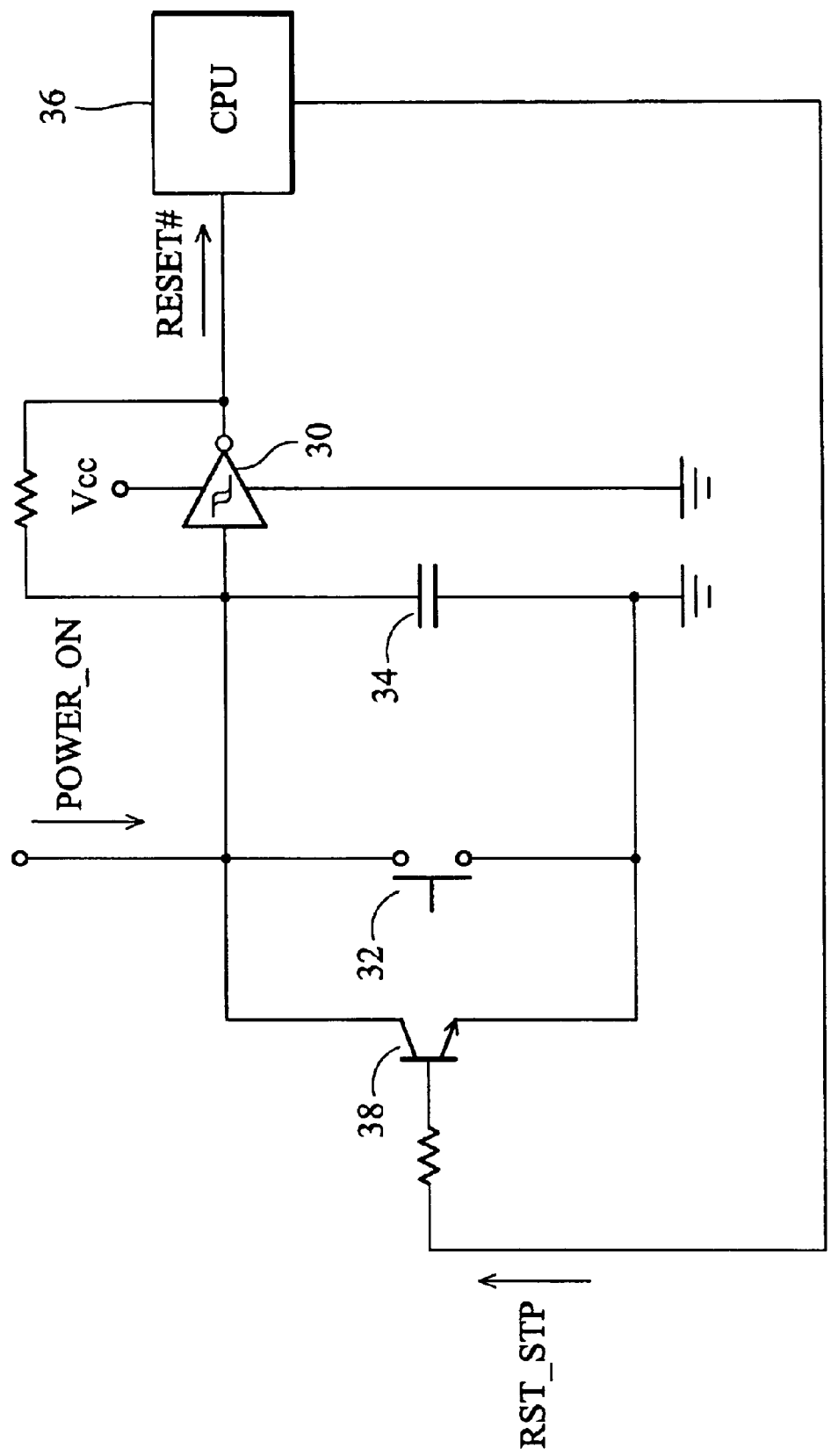
FIG. 3 shows a power-on reset circuit according to the second embodiment of the present invention.

FIG. 3 shows a power-on reset circuit according to the second embodiment of the present invention. The low logic-level reset signal RESET# is generated when a high logic-level power-on pulse POWER_ON is input to an inverter 30. In the second embodiment, the default level of the reset signal RESET# is low-logic level. In addition, the inverter 30 can also be a Schmitt trigger, which is more noise tolerant. The reset signal RESET# is also generated by operating the manual switch 32. The Schmitt trigger 30 outputs the reset signal RESET# with low logic-level, which is fed back to the capacitor 34 to decrease the voltage difference between both terminals of the capacitor 34. The Schmitt trigger 30 has different threshold voltages, which are high threshold voltage and low threshold voltage. Thus, when the voltage difference between both terminals of the capacitor 34 is lower than the low threshold voltage of the Schmitt trigger 30, the Schmitt trigger 30 outputs a high logic-level signal. In addition, the high logic-level signal is still fed back to the capacitor 34 to charge it until the voltage difference between both terminals of the capacitor 34 exceeds the high threshold voltage. Thus, the oscillating circuit (Schmitt trigger) continuously outputs the reset signals RESET#. The reset signal RESET# output by the Schmitt trigger 30 is input to the CPU 36, then the CPU 36 performs initialization according the low logic-level reset signal RESET#. Because the CPU 36 continuously receives the reset signals RESET#, even if the initialization of the CPU 36 fails, the initialization is performed again by triggering the following reset signal RESET#. Thus, ensuring the success of the initialization of the CPU 36.

After the CPU 36 is initialized, the CPU 36 outputs an oscillating disable signal RST_STP representing the completed initialization of the CPU 36. The oscillating disable signal RST_STP is generated by changing the firmware or hardware of the CPU. According to the second embodiment of the present invention, the oscillating disable signal RST_STP is at high-logic level, which turns on the switch 38. The switch 38 is an NPN transistor because the oscillating disable signal RST_STP is at high-logic level. When the switch 38 is turned on, the voltage level of the input terminal of the Schmitt trigger 30 is decreased to low-logic level. Thus, the Schmitt trigger 30 continuously outputs high-logic level signals. As mentioned above, the default logic-level of the reset signal RESET# is low; thus, the reset of the CPU is stopped when the logic-level of the reset signal RESET goes to high. Therefore, the power-on reset procedure is completed. Here, the output period of the oscillating circuit must exceed the time period between the CPU receiving the reset signal RESET# and the CPU outputting the oscillating disable signal RST_STP representing the completed initialization of the CPU is to avoid a system error.

Figure 1:
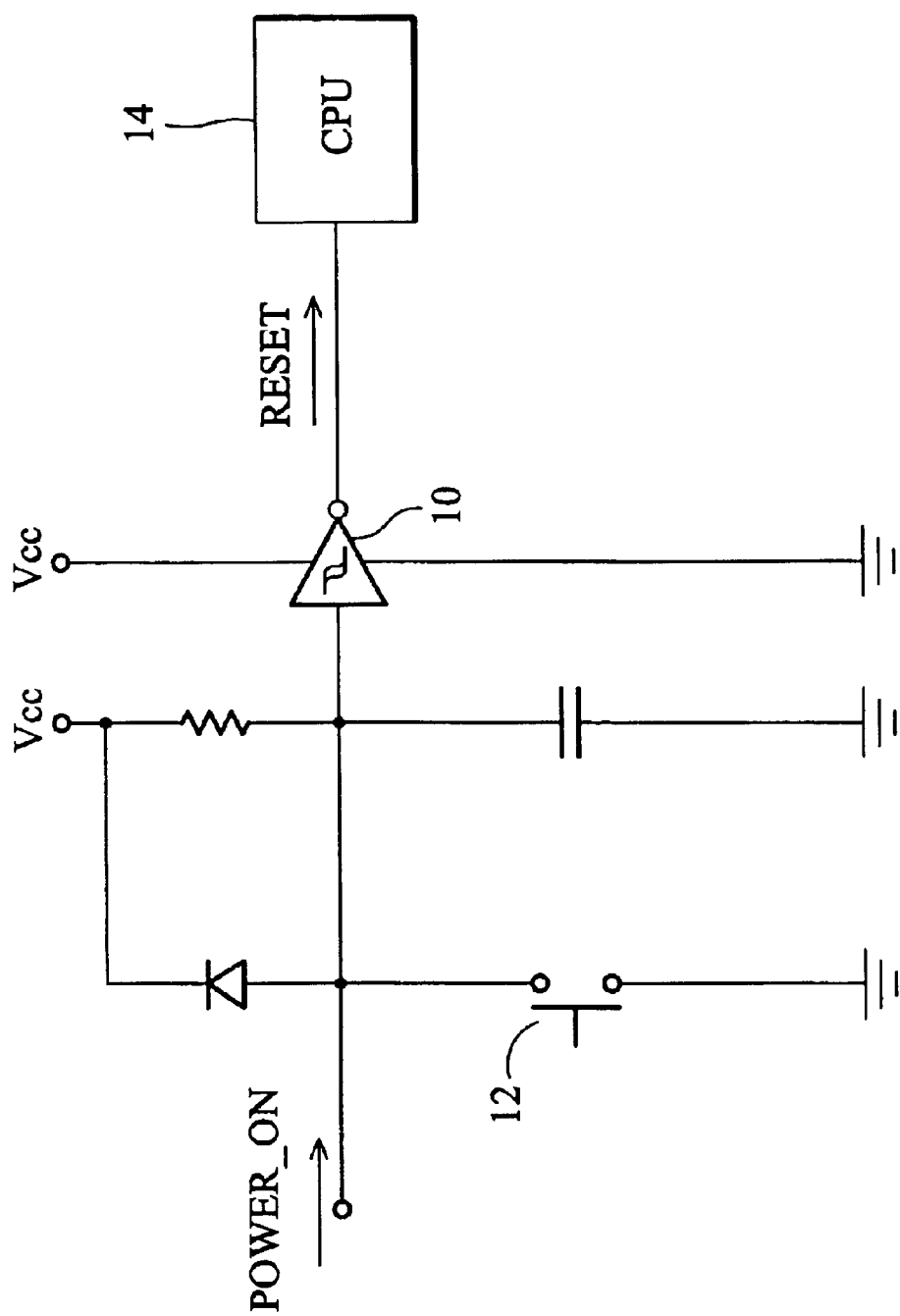
FIG. 1 shows a conventional power-on reset circuit.

The reset pulse generator according to the embodiments of the present invention provides a sequence of reset pulses to the CPU, and stops output of the reset pulse after identifying that the CPU has been successfully initialized by detecting the signal generated by the CPU. Thus, the initialization of the CPU is ensured. In addition, compared with the conventional reset pulse generator as shown in FIG. 1, the number of electronic elements is the same, thus, the size and the cost of the reset pulse generator according to the embodiments of the present invention does not increase. The successful initialization of the CPU, however, is ensured. Therefore, the power-on reset circuit according to the embodiments of the present invention solves the problem of the prior art and is has industrial utility.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A reset pulse generator for a CPU, which generates an oscillating disable signal after initialization, comprising:
    an oscillating circuit coupled to the CPU to output a sequence of reset pulses to the CPU; and
    an oscillating disable circuit coupled to the oscillating circuit for disabling the oscillating circuit and initiating normal mode CPU operation when the oscillating disable signal is received.

2. The reset pulse generator as claimed in claim 1, wherein the oscillating circuit comprises:
    a Schmitt trigger having an input terminal and an output terminal;
    a resistor coupled between the input terminal and the output terminal; and
    a capacitor coupled to the input terminal and a ground level.

3. The reset pulse generator as claimed in claim 1, wherein the oscillating disable circuit is a switch turned on by the oscillating disable signal to stop oscillation of the oscillating circuit.

4. The reset pulse generator as claimed in claim 1, further comprising a manual switch to generate a start signal to enable the oscillating circuit.

5. The reset pulse generator as claimed in claim 1, wherein the start signal is generated during power on.

6. A reset pulse generator, comprising:
    a CPU for generating an oscillating disable signal after initialization;
    an oscillating circuit coupled to the CPU to output a sequence of reset pulses to the CPU; and
    an oscillating disable circuit coupled to the oscillating circuit for disabling the oscillating circuit and initiating normal mode CPU operation when the oscillating disable signal is received.

7. The reset pulse generator as claimed in claim 6, wherein the oscillating circuit comprises:
    a Schmitt trigger having an input terminal and an output terminal;
    a resistor coupled between the input terminal and the output terminal; and
    a capacitor coupled to the input terminal and a ground level.

8. The reset pulse generator as claimed in claim 6, wherein the oscillating disable circuit is a switch turned on by the oscillating disable signal to stop oscillation of the oscillating circuit.

9. The reset pulse generator as claimed in claim 6, further comprising a manual switch to generate a start signal to enable the oscillating circuit.

10. The reset pulse generator as claimed in claim 6, wherein the start signal is generated during power on.

* * * * *